(12) United States Patent
Hasegawa et al.

(10) Patent No.: US 11,377,726 B2
(45) Date of Patent: Jul. 5, 2022

(54) SPUTTERING TARGET MATERIAL

(71) Applicant: Sanyo Special Steel Co., Ltd., Himeji (JP)

(72) Inventors: Hiroyuki Hasegawa, Himeji (JP); Noriaki Matsubara, Himeji (JP)

(73) Assignee: Sanyo Special Steel Co., Ltd., Himeji (JP)

( * ) Notice: Subject to any disclaimer, the term of this patent is extended or adjusted under 35 U.S.C. 154(b) by 175 days.

(21) Appl. No.: 16/986,331

(22) Filed: Aug. 6, 2020

(65) Prior Publication Data

US 2020/0362451 A1   Nov. 19, 2020

Related U.S. Application Data

(63) Continuation of application No. 15/760,404, filed as application No. PCT/JP2016/077459 on Sep. 16, 2016, now abandoned.

(30) Foreign Application Priority Data

Sep. 18, 2015  (JP) ................................. 2015-184846
Jan. 22, 2016  (JP) ................................. 2016-010266

(51) Int. Cl.

| | | |
|---|---|---|
| *C23C 14/34* | (2006.01) | |
| *C22C 19/07* | (2006.01) | |
| *C22C 30/00* | (2006.01) | |
| *C22C 38/12* | (2006.01) | |
| *C22C 38/14* | (2006.01) | |
| *C22C 38/16* | (2006.01) | |
| *C22C 38/00* | (2006.01) | |
| *C22C 38/08* | (2006.01) | |
| *H01F 41/18* | (2006.01) | |
| *C22C 33/02* | (2006.01) | |
| *H01J 37/34* | (2006.01) | |
| *C22C 38/18* | (2006.01) | |
| *B22F 1/052* | (2022.01) | |
| *C22C 1/04* | (2006.01) | |
| *C22C 38/10* | (2006.01) | |

(52) U.S. Cl.
CPC .......... *C23C 14/3414* (2013.01); *B22F 1/052* (2022.01); *C22C 1/0433* (2013.01); *C22C 19/07* (2013.01); *C22C 30/00* (2013.01); *C22C 33/0257* (2013.01); *C22C 33/0278* (2013.01); *C22C 33/0285* (2013.01); *C22C 38/002* (2013.01); *C22C 38/08* (2013.01); *C22C 38/10* (2013.01); *C22C 38/12* (2013.01); *C22C 38/14* (2013.01); *C22C 38/16* (2013.01); *C22C 38/18* (2013.01); *H01F 41/183* (2013.01); *H01J 37/3426* (2013.01); *B22F 2998/10* (2013.01)

(58) Field of Classification Search
CPC ... C23C 14/3414; C23C 1/0433; C23C 19/07; C23C 30/00; C23C 33/0257; C23C 33/0278; C23C 33/0285; C23C 38/002; C23C 38/08; C23C 38/10; C23C 38/12; C23C 38/14; C23C 38/16; C23C 38/18; H01F 41/183

See application file for complete search history.

(56) References Cited

U.S. PATENT DOCUMENTS

| | | |
|---|---|---|
| 9,208,812 B2 | 12/2015 | Sawada et al. |
| 9,269,389 B2 | 2/2016 | Arakawa |
| 2005/0011308 A1 | 1/2005 | Ueno et al. |
| 2007/0017803 A1 | 1/2007 | Ziani et al. |
| 2007/0251821 A1 | 11/2007 | Yanagitani et al. |
| 2015/0357170 A1 | 12/2015 | Ohashi et al. |
| 2016/0237552 A1* | 8/2016 | Arakawa ............ H01J 37/3426 |
| 2018/0019389 A1 | 1/2018 | Arakawa |

FOREIGN PATENT DOCUMENTS

| | | |
|---|---|---|
| JP | 2003226963 A | 8/2003 |
| JP | 2004346423 A | 12/2004 |
| JP | 2005320627 A | 11/2005 |
| JP | 200731827 A | 2/2007 |
| JP | 2012207274 A | 10/2012 |
| WO | 2011070860 A1 | 6/2011 |
| WO | 2012026405 A1 | 3/2012 |
| WO | 2015019513 A1 | 2/2015 |
| WO | 2015080009 A1 | 6/2015 |
| WO | 2015166762 A1 | 11/2015 |
| WO | 2016140113 A1 | 9/2016 |

* cited by examiner

*Primary Examiner* — John J Brayton
(74) *Attorney, Agent, or Firm* — The Webb Law Firm

(57) ABSTRACT

A method of making a sputtering target in which an atomized powder including, in at. %, 10 to 50% of B, 0 to 20% in total of one or more elements selected from the group consisting of Ti, Zr, Hf, V, Nb, Ta, Cr, Mo, W, Mn, Re, Ru, Rh, Ir, Ni, Pd, Pt, Cu, and Ag, and a balance of one or both of Co and Fe, and unavoidable impurities is provided. Fine particles are removed from the atomized powder to obtain a powder having a particle distribution where the cumulative volume of particles having a particle diameter of 5 μm or less is 10% or less, and the cumulative volume of particles having a particle diameter of 30 μm or less is 5-40%. The obtained powder is sintered to form a sputtering target comprising a sintered body. The sputtering target comprises hydrogen of 20 ppm or less.

12 Claims, No Drawings

SPUTTERING TARGET MATERIAL

CROSS-REFERENCE TO RELATED APPLICATIONS

This application is a continuation of Ser. No. 15/760,404 filed Mar. 15, 2018, which is the United States national phase of International Application No. PCT/JP2016/077459 filed Sep. 16, 2016, and claims priority to Japanese Patent Application Nos. 2015-184846 and 2016-010266 filed Sep. 18, 2015, and Jan. 22, 2016, respectively, the disclosures of each of which are hereby incorporated by reference in their entirety.

BACKGROUND OF THE INVENTION

Field of the Invention

The present invention relates to a sputtering target material useful for producing an alloy thin film in a magnetic tunneling junction (MTJ) element, an HDD, a medium for magnetic recording, or the like.

Background Art

A magnetic random-access memory (MRAM) includes a magnetic tunneling junction (MTJ) element. Such a magnetic tunneling junction (MTJ) element has a structure such as CoFeB/MgO/CoFeB and exhibits features such as a high tunnel magnetoresistance (TMR) signal and a low switching current density (Jc).

A CoFeB thin film of a magnetic tunneling junction (MTJ) element is formed by sputtering a CoFeB target. Examples of known CoFeB sputtering target materials include a sputtering target material produced by sintering an atomized powder as disclosed in Japanese Patent Laid-Open Publication No. 2004-346423

SUMMARY OF THE INVENTION

Technical Problem

A method in which an atomized powder is sintered to produce a sputtering target material in such a manner as in Japanese Patent Laid-Open Publication No. 2004-346423 is an effective technique. However, only the method described in Japanese Patent Laid-Open Publication No. 2004-346423 does not make it possible to produce a favorable target material. In other words, there is a problem in that only simple sintering of an atomized powder results in a decrease in the strength of a sputtering target material.

Solution to Problem

As a result of intensively advancing development in order to solve the problem described above, the present inventors found that the mechanical strength of a sputtering target can be improved by reducing the content of hydrogen in a sputtering target material. Thus, the present invention was accomplished.

The present invention encompasses the following inventions:

[1] A sputtering target material comprising in at. %: 10 to 50% of B; 0 to 20% in total of one or more elements selected from the group consisting of Ti, Zr, Hf, V, Nb, Ta, Cr, Mo, W, Mn, Re, Ru, Rh, Ir, Ni, Pd, Pt, Cu, and Ag; and the balance of at least one of Co and Fe, and unavoidable impurities, wherein a hydrogen content is 20 ppm or less.

[2] The sputtering target material according to the above [1], wherein the sputtering target material comprises, in at. %, 5 to 20% in total of one or more elements selected from the group consisting of Ti, Zr, Hf, V, Nb, Ta, Cr, Mo, W, Mn, Re, Ru, Rh, Ir, Ni, Pd, Pt, Cu, and Ag.

[3] The sputtering target material according to the above [1], wherein the sputtering target material has a bending strength of 200 MPa or more.

Advantageous Effects of Invention

According to the present invention, a sputtering target material having excellent mechanical strength is provided.

DETAILED DESCRIPTION OF THE INVENTION

The present invention will be described in detail below. Unless otherwise specified, "%" in the present invention means at. %.

In a sputtering target material according to the present invention, the content of B is 10 to 50%. An alloy thin film formed in sputtering does not sufficiently become amorphous when the content of B is less than 10%, while the strength of a sputtering target material decreases even if the content of hydrogen is 20 ppm or less when the content of B is more than 50%. Therefore, the content of B is adjusted to 10 to 50%. The content of B is preferably 20 to 50%.

In the sputtering target material according to the present invention, the total content of one or more elements selected from the group (hereinafter may be referred to as "element group") consisting of Ti, Zr, Hf, V, Nb, Ta, Cr, Mo, W, Mn, Re, Ru, Rh, Ir, Ni, Pd, Pt, Cu, and Ag is 0 to 20%. When only one kind of an element is selected from the above element group, "total content of one or more elements selected from the above element group" means the content of the one element. The strength of the sputtering target material decreases even if the content of hydrogen is 20 ppm or less when the total content of one or more elements selected from the above element group is more than 20%. Therefore, the content of one or more elements selected from the above element group is adjusted to 20% or less. The total content of one or more elements selected from the above element group is preferably 12% or less, and still more preferably 10% or less. When the sputtering target material according to the present invention does not contain one or more elements selected from the above element group, the total content thereof is 0%. When the sputtering target material according to the present invention contains one or more elements selected from the above element group, the total content thereof can be adjusted in a range of from more than 0 to 20% as appropriate, and is, for example, 5% or more.

The sputtering target material according to the present invention comprises the balance of at least one of Co and Fe, and unavoidable impurities.

Co and Fe are elements that impart magnetism. The total content of Co and Fe is 30% or more. When the sputtering target material according to the present invention contains only one of Co and Fe, "total content of Co and Fe" means the content of the one. The total content of Co and Fe is preferably 40% or more, and still more preferably 50% or more.

In the sputtering target material according to the present invention, the content of hydrogen is 20 ppm or less. Hydrogen is an element that is unavoidably present in a powder (for example, an atomized powder such as a gas-atomized powder) used as a raw material of the sputtering target material. However, the strength of the sputtering target material decreases when the content of hydrogen remaining in the sputtering target material is more than 20 ppm. Therefore, the content of hydrogen is adjusted to 20 ppm or less. The content of hydrogen is preferably 10 ppm or less. The sputtering target material according to the present invention may contain up to 1000 ppm of other unavoidable impurities.

The sputtering target material in which the content of hydrogen is 20 ppm or less can be produced by: removing coarse particles having a particle diameter of 500 µm or more from an atomized powder of an alloy comprising 10 to 50% of B, 0 to 20% in total of one or more elements selected from the group consisting of Ti, Zr, Hf, V, Nb, Ta, Cr, Mo, W, Mn, Re, Ru, Rh, Ir, Ni, Pd, Pt, Cu, and Ag, and the balance of at least one of Co and Fe, and unavoidable impurities; then removing fine particles from the powder from which the coarse particles have been removed, to prepare a powder that satisfies any of particle size conditions A, B, and C; and then sintering the powder that satisfies any of the particle size conditions A, B, and C.

The particle size conditions A, B, and C are defined as follows.

The particle size condition A is defined as a condition that the cumulative volume of particles having a particle diameter of 5 µm or less is 10% or less, and the cumulative volume of particles having a particle diameter of 30 µm or less is 40% or less, in the particle size distribution of powder (particle assemblage).

The particle size condition B is defined as a condition that the cumulative volume of particles having a particle diameter of 5 µm or less is 8% or less, and the cumulative volume of particles having a particle diameter of 30 µm or less is 35% or less, in the particle size distribution of a powder (particle assemblage).

The particle size condition C is defined as a condition that the cumulative volume of particles having a particle diameter of 5 µm or less is 5% or less, and the cumulative volume of particles having a particle diameter of 30 µm or less is 30% or less, in the particle size distribution of a powder (particle assemblage).

A powder that satisfies all the particle size conditions A, B, and C is regarded as a powder that satisfies the particle size condition C, and a powder that satisfies the particle size conditions A and B is regarded as a powder that satisfies the particle size condition B. In addition, "particle diameter" and "particle size distribution" mean a particle diameter and a particle size distribution, measured by a laser diffraction/scattering-type particle size distribution measurement apparatus (MICROTRAC).

All of the particle size conditions A, B, and C are conditions for removing coarse particles having a particle diameter of 500 µm or more from a powder (for example, an atomized powder such as a gas-atomized powder) as a raw material of the sputtering target material and then removing fine particles from the powder from which the coarse particles have been removed. In each particle size condition, a particle size distribution is set under the two conditions, i.e., the first condition regarding the amount of particles having a particle diameter of 5 µm or less and the second condition regarding the amount of particles having a particle diameter of 30 µm or less. In the particle size condition A, the cumulative volume of particles having a particle diameter of 5 µm or less is regulated to 10% or less in the first condition, and the cumulative volume of particles having a larger particle size and having a particle diameter of 30 µm or less is regulated to 40% or less in the second condition. In the particle size condition B, the cumulative volume of particles having a particle diameter of 5 µm or less is regulated to 8% or less in the first condition, and the cumulative volume of particles having a particle diameter of 30 µm or less is regulated to 35% or less in the second condition. In the particle size condition C, the cumulative volume of particles having a particle diameter of 5 µm or less is regulated to 5% or less in the first condition, and the cumulative volume of particles having a particle diameter of 30 µm or less is regulated to 30% or less in the second condition. In other words, in the particle size conditions A, B, and C, the cumulative volume of particles having a particle diameter of 5 µm or less is regulated to be decreased to 10% or less, 8% or less, and 5% or less in a stepwise manner, and the cumulative volume of particles having a particle diameter of 30 µm or less is regulated to be decreased to 40% or less, 35% or less, and 30% or less in a stepwise manner. The hydrogen content and bending strength of a sputtering target material produced using a gas-atomized powder that satisfies any of the particle size conditions A, B, and C are shown in Examples.

A powder that satisfies any of the particle size conditions A, B, and C can be prepared by removing coarse particles having a particle diameter of 500 µm or more, which are not suitable for molding, from a powder (for example, an atomized powder such as a gas-atomized powder) as a raw material of the sputtering target material, and then removing fine particles from the powder from which the coarse particles have been removed. Examples of atomization methods for producing the atomized powder include a gas atomization method, a water atomization method, a disk atomization method, and a plasma atomization method. A gas atomization method is preferred. The removal of the coarse particles having a particle diameter of 500 µm or more can be performed by classification using a sieve having an opening of 500 µm or less, for example, an opening of 250 to 500 µm. The removal of the fine particles for preparing the powder that satisfies any of the particle size conditions A, B, and C can be performed by classification using sieves having an opening of 5 µm or less and/or an opening of 30 µm or less. The content of hydrogen can be set at 20 ppm or less by producing a solidified molded product by using the powder that satisfies any of the particle size conditions A, B, and C. A sputtering target material can be produced by processing the solidified molded product into a disk shape by wire cut, turning processing, and plane polishing. The sputtering target material produced in such a manner has improved strength.

The sputtering target material according to the present invention preferably has a bending strength of 200 MPa or more. The sputtering target material according to the present invention has a bending strength of, for example, 210 MPa or more, 220 MPa or more, 230 MPa or more, 240 MPa or more, 250 MPa or more, 260 MPa or more, 270 MPa or more, 280 MPa or more, 290 MPa or more, or 300 MPa or more.

The bending strength is measured as follows. A specimen having a longitudinal length of 4 mm, a width of 25 mm, and a thickness of 3 mm, obtained from a sintered alloy by division by a wire, is evaluated by a three-point bending test, to obtain three-point bending strength as the bending strength. In the three-point bending test conducted at a supporting-point distance of 20 mm, a three-point bending strength is calculated from a stress (N) measured when a pressure is applied downward in a thickness direction to a plane having a longitudinal length of 4 mm and a width of 25 mm, on the basis of the following equation:
a. three-point bending strength (MPa)=(3×stress (N)×supporting-point distance (mm)/(2×specimen width (mm)×(specimen thickness (mm)$^2$).

EXAMPLES

The sputtering target material according to the present invention will be specifically described below with reference to Examples.
b. A molten raw material was weighed for each composition shown in Tables 1, 2, 5, and 6, induction-heating melted in a refractory crucible having an Ar gas atmosphere with a reduced pressure or a vacuum atmosphere, then tapped from a nozzle having a diameter of 8 mm in the lower portion of the crucible, and gas-atomized with an Ar gas. A solidification rate can be controlled by adjusting the injection pressure of the Ar gas. The solidification rate is increased with increasing the injection pressure. The particle size distribution of a gas-atomized powder can be adjusted by controlling the solidification rate. The width of the particle size distribution is decreased with increasing the solidification rate.

A powder that satisfied any of the particle size conditions A, B, and C was prepared by removing coarse particles having a particle diameter of 500 μm or more, which were not suitable for molding, from the obtained gas-atomized powder, and then removing fine particles from the powder from which the coarse particles had been removed. The removal of the coarse particles having a particle diameter of 500 μm or more, which were not suitable for molding, was performed by classification using a sieve having an opening of 500 μm. The removal of the fine particles for preparing the powder that satisfied the particle size condition A was performed by classification using a sieve having an opening of 35 μm. The removal of the fine particles for preparing the powder that satisfied the particle size condition B was performed by classification using a sieve having an opening of 30 μm. The removal of the fine particles for preparing the powder that satisfied the particle size condition C was performed by classification using a sieve having an opening 25 μm. The powder that satisfied any of the particle size conditions A, B, and C was put in a furnace at 110° C. and dried to remove water from the powder. The dried powder was used as a raw powder. The raw powder was degassing-charged into an SC can having an outer diameter of 220 mm, an inner diameter of 210 mm, and a length of 200 mm, and the powder-filled billet was sintered under each condition shown in Table 1 or Table 2 to produce a sintered body.

A molten raw material was weighed for each composition shown in the raw powder columns of Table 3 and Table 7.

In a manner similar to the case of each composition shown in Tables 1, 2, 5, and 6, the molten raw material was induction-heating melted in a refractory crucible having an Ar gas atmosphere with a reduced pressure or a vacuum atmosphere, then tapped from a nozzle having a diameter of 8 mm in the lower portion of the crucible, and gas-atomized with an Ar gas. Commercially available powders having a powder size of 150 μm or less were used as pure Ti, pure B, pure V, and pure Cr among the raw powders shown in Table 7. A powder that satisfied any of the particle size conditions A, B, and C was prepared by removing coarse particles having a particle diameter of 500 μm or more, which were not suitable for molding, from the obtained gas-atomized powder, and then classifying the powder from which the coarse particles had been removed, to remove fine particles. The removal of the coarse particles and the fine particles was performed in manners similar to the manners described above. The powder that satisfied any of the particle size conditions A, B, and C was put in a furnace at 110° C. and dried to remove water from the powder. Such dried powders were used as raw powders. The raw powders were mixed at a mixture ratio shown in Table 3 in a V-type mixer for 30 minutes to thereby form a composition shown in Table 3, and the resultant mixture was degassing-charged into an SC can having an outer diameter of 220 mm, an inner diameter of 210 mm, and a length of 200 mm. The powder-filled billet described above was sintered under conditions shown in Table 3 to produce a sintered body. The solidified molded product produced by the method described above was processed into a disk shape having a diameter of 180 mm and a thickness of 7 mm by wire cut, turning processing, and plane polishing, to form a sputtering target material.

Then, a molten raw material was weighed for each composition shown in Table 4, induction-heating melted in a refractory crucible having an Ar gas atmosphere with a reduced pressure or a vacuum atmosphere, then tapped from a nozzle having a diameter of 8 mm in the lower portion of the crucible, and gas-atomized with an Ar gas. Coarse particles having a particle diameter of 500 μm or more, which were not suitable for molding, were removed from the obtained gas-atomized powder, and the powder from which the coarse particles had been removed and from which fine particles were not removed was used as a raw powder. The raw powder was degassing-charged into an SC can having an outer diameter of 220 mm, an inner diameter of 210 mm, and a length of 200 mm. The powder-filled billet described above was sintered under conditions shown in Table 4 to produce a sintered body. The solidified molded product produced by the method described above was processed into a disk shape having a diameter of 180 mm and a thickness of 7 mm by wire cut, turning processing, and plane polishing, to form a sputtering target material.

TABLE 1

| No | Composition of sputtering target material (at. %) | | | Particle size condition | Particle size | Molding temperature (° C.) | Molding time (h) | Molding pressure (MPa) | Hydrogen content (ppm) | Bending strength (Mpa) | Remarks |
|---|---|---|---|---|---|---|---|---|---|---|---|
| | Co | Fe | B | | | | | | | | |
| 1 | 31.5 | 58.5 | 10 | A | ≤5 μm: 9% ≤30 μm: 38% | 1000 | 2 | 100 | 18 | 820 | Present Invention Examples |
| 2 | 33.25 | 51.75 | 15 | B | ≤5 μm: 6% ≤30 μm: 33% | 1000 | 2 | 100 | 10 | 900 | |

TABLE 1-continued

| No | Composition of sputtering target material (at. %) | | | Particle size condition | Particle size | Molding temperature (° C.) | Molding time (h) | Molding pressure (MPa) | Hydrogen content (ppm) | Bending strength (Mpa) | Remarks |
|---|---|---|---|---|---|---|---|---|---|---|---|
| | Co | Fe | B | | | | | | | | |
| 3 | 28 | 52 | 20 | A | ≤5 μm: 6%<br>≤30 μm: 33% | 1000 | 2 | 100 | 13 | 580 | |
| 4 | 18 | 72 | 10 | A | ≤5 μm: 7%<br>≤30 μm: 37% | 1000 | 2 | 100 | 15 | 790 | |
| 5 | 60 | 20 | 20 | B | ≤5 μm: 3%<br>≤30 μm: 32% | 1000 | 2 | 150 | 9 | 630 | |
| 6 | 72 | 8 | 20 | A | ≤5 μm: 3%<br>≤30 μm: 36% | 1000 | 2 | 150 | 14 | 650 | |
| 7 | 90 | 0 | 10 | C | ≤5 μm: 4%<br>≤30 μm: 25% | 700 | 3 | 150 | 8 | 880 | |
| 8 | 80 | 0 | 20 | C | ≤5 μm: 2%<br>≤30 μm: 21% | 800 | 3 | 150 | 6 | 630 | |
| 9 | 70 | 0 | 30 | B | ≤5 μm: 6%<br>≤30 μm: 32% | 1000 | 3 | 100 | 8 | 480 | |
| 10 | 60 | 0 | 40 | C | ≤5 μm: 4%<br>≤30 μm: 18% | 1100 | 3 | 100 | 4 | 260 | |
| 11 | 50 | 0 | 50 | C | ≤5 μm: 0%<br>≤30 μm: 25% | 1100 | 5 | 150 | 3 | 250 | |
| 12 | 83 | 5 | 12 | A | ≤5 μm: 10%<br>≤30 μm: 40% | 800 | 5 | 150 | 15 | 670 | |
| 13 | 5 | 70 | 25 | B | ≤5 μm: 8%<br>≤30 μm: 35% | 1100 | 5 | 150 | 9 | 690 | |
| 14 | 62 | 10 | 28 | A | ≤5 μm: 8%<br>≤30 μm: 39% | 800 | 5 | 150 | 14 | 400 | |
| 15 | 48 | 20 | 32 | A | ≤5 μm: 9%<br>≤30 μm: 35% | 800 | 5 | 150 | 17 | 300 | |
| 16 | 22 | 40 | 38 | C | ≤5 μm: 5%<br>≤30 μm: 30% | 900 | 5 | 150 | 6 | 290 | |
| 17 | 25 | 30 | 45 | A | ≤5 μm: 8%<br>≤30 μm: 38% | 1000 | 4 | 150 | 8 | 280 | |
| 18 | 5 | 45 | 50 | B | ≤5 μm: 5%<br>≤30 μm: 35% | 1000 | 3 | 100 | 15 | 580 | |
| 19 | 70 | 5 | 25 | A | ≤5 μm: 9%<br>≤30 μm: 38% | 800 | 5 | 150 | 12 | 660 | |
| 20 | 40 | 40 | 20 | B | ≤5 μm: 5%<br>≤30 μm: 31% | 800 | 5 | 150 | 10 | 650 | |

TABLE 2

| No. | Composition of sputtering target material (at. %) | | | Particle size condition | Particle size | Molding temperature (° C.) | Molding time (h) | Molding pressure (MPa) | Hydrogen content (ppm) | Bending strength (Mpa) | Remarks |
|---|---|---|---|---|---|---|---|---|---|---|---|
| | Co | Fe | B | | | | | | | | |
| 21 | 60 | 20 | 20 | C | ≤5 μm: 2%<br>≤30 μm: 27% | 800 | 5 | 150 | 5 | 630 | Present Invention Examples |
| 22 | 0 | 90 | 10 | A | ≤5 μm: 10%<br>≤30 μm: 39% | 800 | 4 | 130 | 12 | 820 | |

TABLE 2-continued

| No. | Composition of sputtering target material (at. %) Co | Fe | B | Particle size condition | Particle size | Molding temperature (° C.) | Molding time (h) | Molding pressure (MPa) | Hydrogen content (ppm) | Bending strength (Mpa) | Remarks |
|---|---|---|---|---|---|---|---|---|---|---|---|
| 23 | 0 | 80 | 20 | A | ≤5 μm: 8% ≤30 μm: 39% | 800 | 5 | 130 | 15 | 580 | |
| 24 | 0 | 70 | 30 | A | ≤5 μm: 10% ≤30 μm: 36% | 700 | 3 | 130 | 15 | 380 | |
| 25 | 0 | 60 | 40 | A | ≤5 μm: 10% ≤30 μm: 39% | 1000 | 5 | 130 | 12 | 230 | |
| 26 | 0 | 50 | 50 | B | ≤5 μm: 7% ≤30 μm: 33% | 1100 | 5 | 130 | 7 | 250 | |

TABLE 3

| No. | Composition of sputtering target material (at. %) | Mixed raw powder (at. %) ( ): mixture ratio | Particle size condition | Particle size | Molding temperature (° C.) | Molding time (h) | Molding pressure (MPa) | Hydrogen content (ppm) | Bending strength (Mpa) | Remarks |
|---|---|---|---|---|---|---|---|---|---|---|
| 27 | 20Co—60Fe—20B | Fe—1Co—20B(25) Co—20B(75) | A | ≤5 μm: 8% ≤30 μm: 36% | 1000 | 5 | 150 | 14 | 610 | Present Invention Examples |
| 28 | 40Co—40Fe—20B | Fe—1Co—20B(50) Co—20B(50) | B | ≤5 μm: 7% ≤30 μm: 34% | 1000 | 5 | 100 | 8 | 640 | |
| 29 | 60Co—20Fe—20B | Fe—1Co—20B(75) Co—20B(25) | B | ≤5 μm: 6% ≤30 μm: 32% | 900 | 4 | 130 | 12 | 600 | |
| 30 | 50Co—20Fe—30B | Fe—1Co—30B(28) Co—30B(72) | C | ≤5 μm: 4% ≤30 μm: 28% | 1000 | 2 | 120 | 8 | 480 | |
| 31 | 15Co—45Fe—40B | Fe—1Co—40B(75) Co—40B(25) | B | ≤5 μm: 6% ≤30 μm: 33% | 1100 | 3 | 150 | 7 | 230 | |
| 32 | 40Co—10Fe—50B | Fe—1Co—40B(20) Co—40B(80) | B | ≤5 μm: 5% ≤30 μm: 31% | 1100 | 2 | 150 | 8 | 220 | |

TABLE 4

| No. | Composition of sputtering target material (at. %) Co | Fe | B | Particle size | Molding temperature (° C.) | Molding time (h) | Molding pressure (MPa) | Hydrogen content (ppm) | Bending strength (Mpa) | Remarks |
|---|---|---|---|---|---|---|---|---|---|---|
| 33 | 31.5 | 58.5 | 10 | ≤5 μm: <u>11%</u> ≤30 μm: 39% | 1000 | 2 | 100 | <u>25</u> | 150 | Comparative Examples |
| 34 | 33.25 | 61.75 | <u>5</u> | ≤5 μm: 9% ≤30 μm: <u>41%</u> | 1000 | 2 | 100 | <u>30</u> | 180 | |
| 35 | 28 | 52 | 20 | ≤5 μm: <u>12%</u> ≤30 μm: 34% | 1000 | 2 | 100 | <u>25</u> | 130 | |
| 36 | 18 | 72 | 10 | ≤5 μm: 7% ≤30 μm: <u>42%</u> | 1000 | 2 | 100 | <u>22</u> | 160 | |
| 37 | 60 | 20 | 20 | ≤5 μm: <u>13%</u> ≤30 μm: 29% | 1000 | 2 | 100 | <u>23</u> | 150 | |

TABLE 4-continued

| | Composition of sputtering target material (at. %) | | | | Molding temperature | Molding time | Molding pressure | Hydrogen content | Bending strength | |
|---|---|---|---|---|---|---|---|---|---|---|
| No. | Co | Fe | B | Particle size | (° C.) | (h) | (MPa) | (ppm) | (Mpa) | Remarks |
| 38 | 72 | 8 | 20 | ≤5 μm: 4% ≤30 μm: 43% | 1000 | 2 | 100 | <u>25</u> | 140 | |
| 39 | 70 | 0 | 30 | ≤5 μm: <u>14%</u> ≤30 μm: <u>45%</u> | 1000 | 5 | 150 | <u>26</u> | 100 | |

NOTE:
The underlined figures fall outside the scope of the present invention.

TABLE 5

| | Composition of sputtering target material (at. %) | | | | | | | | | | | | | | | | Particle size condition |
|---|---|---|---|---|---|---|---|---|---|---|---|---|---|---|---|---|---|
| | | | | | | | | | Others | | | | | | | Total of others | |
| No. | Co | Fe | B | Ti | Zr | Hf | V | Nb | Ta | Cr | Mo | W | Mn | Ni | Cu | Others | | |
| 40 | 65 | 0 | 30 | 5 | 0 | 0 | 0 | 0 | 0 | 0 | 0 | 0 | 0 | 0 | 0 | — | 5 | A |
| 41 | 65 | 5 | 20 | 5 | 1 | 1 | 1 | 1 | 1 | 0 | 0 | 0 | 0 | 0 | 0 | — | 10 | B |
| 42 | 55 | 15 | 10 | 9 | 1 | 1 | 1 | 1 | 1 | 1 | 1 | 1 | 1 | 1 | 0 | Pt: 1 | 20 | C |
| 43 | 45 | 30 | 15 | 0 | 10 | 0 | 0 | 0 | 0 | 0 | 0 | 0 | 0 | 0 | 0 | — | 10 | A |
| 44 | 10 | 45 | 30 | 0 | 15 | 0 | 0 | 0 | 0 | 0 | 0 | 0 | 0 | 0 | 0 | — | 15 | B |
| 45 | 10 | 50 | 20 | 0 | 10 | 1 | 1 | 1 | 1 | 1 | 1 | 1 | 1 | 1 | 1 | — | 20 | C |
| 46 | 25 | 60 | 10 | 0 | 0 | 4 | 0 | 0 | 0 | 0 | 0 | 0 | 0 | 0 | 0 | Re: 1 | 5 | A |
| 47 | 5 | 70 | 10 | 0 | 0 | 15 | 0 | 0 | 0 | 0 | 0 | 0 | 0 | 0 | 0 | — | 15 | B |
| 48 | 0 | 70 | 10 | 0 | 0 | 10 | 0 | 2 | 2 | 2 | 2 | 2 | 0 | 0 | 0 | — | 20 | C |
| 49 | 10 | 35 | 50 | 0 | 0 | 0 | 5 | 0 | 0 | 0 | 0 | 0 | 0 | 0 | 0 | — | 5 | A |
| 50 | 0 | 45 | 40 | 0 | 0 | 0 | 10 | 0 | 0 | 0 | 0 | 0 | 0 | 0 | 0 | Ru: 5 | 15 | B |
| 51 | 41 | 4 | 40 | 0 | 0 | 0 | 15 | 0 | 0 | 0 | 0 | 0 | 0 | 0 | 0 | — | 15 | C |
| 52 | 72 | 8 | 10 | 0 | 0 | 0 | 0 | 5 | 0 | 0 | 0 | 0 | 0 | 0 | 0 | Rh: 5 | 15 | C |
| 53 | 61 | 9 | 15 | 0 | 0 | 0 | 0 | 15 | 0 | 0 | 0 | 0 | 0 | 0 | 0 | — | 15 | A |
| 54 | 47 | 13 | 20 | 0 | 0 | 0 | 0 | 10 | 0 | 0 | 10 | 0 | 0 | 0 | 0 | — | 20 | B |
| 55 | 42 | 28 | 20 | 0 | 0 | 0 | 0 | 0 | 10 | 0 | 0 | 0 | 0 | 0 | 0 | — | 10 | A |
| 56 | 29 | 34 | 17 | 10 | 0 | 0 | 0 | 0 | 10 | 0 | 0 | 0 | 0 | 0 | 0 | — | 20 | B |
| 57 | 16 | 46 | 18 | 10 | 0 | 1 | 0 | 0 | 0 | 1 | 1 | 7 | 0 | 0 | 0 | — | 20 | C |
| 58 | 13 | 45 | 22 | 5 | 0 | 0 | 0 | 0 | 0 | 5 | 0 | 0 | 0 | 0 | 0 | Ir: 10 | 20 | A |
| 59 | 12 | 44 | 24 | 0 | 10 | 0 | 0 | 0 | 0 | 10 | 0 | 0 | 0 | 0 | 0 | — | 20 | B |
| 60 | 0 | 60 | 10 | 0 | 10 | 0 | 0 | 0 | 0 | 20 | 0 | 0 | 0 | 0 | 0 | — | 30 | C |
| 61 | 0 | 50 | 30 | 0 | 15 | 0 | 0 | 0 | 0 | 0 | 5 | 0 | 0 | 0 | 0 | — | 20 | A |
| 62 | 35 | 35 | 10 | 0 | 0 | 10 | 0 | 0 | 0 | 0 | 10 | 0 | 0 | 0 | 0 | — | 20 | B |
| 63 | 22 | 48 | 10 | 0 | 0 | 10 | 0 | 0 | 0 | 0 | 5 | 0 | 0 | 0 | 0 | Pd: 5 | 20 | C |
| 64 | 19 | 41 | 20 | 0 | 0 | 15 | 0 | 0 | 0 | 0 | 0 | 5 | 0 | 0 | 0 | — | 20 | A |
| 65 | 41 | 19 | 20 | 0 | 0 | 0 | 10 | 0 | 0 | 0 | 0 | 2 | 3 | 3 | 2 | — | 20 | B |
| 66 | 37 | 23 | 20 | 0 | 0 | 0 | 10 | 0 | 10 | 0 | 0 | 0 | 0 | 0 | 0 | — | 20 | C |
| 67 | 40 | 20 | 20 | 0 | 0 | 0 | 15 | 0 | 0 | 0 | 0 | 0 | 5 | 0 | 0 | — | 20 | A |
| 68 | 55 | 15 | 10 | 0 | 0 | 0 | 0 | 20 | 0 | 0 | 0 | 0 | 0 | 0 | 0 | — | 20 | B |
| 69 | 56 | 14 | 10 | 0 | 0 | 0 | 0 | 10 | 0 | 0 | 0 | 0 | 10 | 0 | 0 | — | 20 | C |
| 70 | 5 | 65 | 10 | 0 | 0 | 0 | 0 | 15 | 0 | 0 | 0 | 0 | 0 | 5 | 0 | — | 20 | A |

| | Particle size | | Molding temperature | Molding time | Molding pressure | Hydrogen content | Bending strength | |
|---|---|---|---|---|---|---|---|---|
| No. | ≤5 μm | ≤30 μm | (° C.) | (h) | (MPa) | (ppm) | (MPa) | Remarks |
| 40 | 10 | 36 | 1000 | 2 | 100 | 20 | 1500 | Present |
| 41 | 6 | 33 | 980 | 2 | 100 | 8 | 800 | Invention |
| 42 | 3 | 29 | 1000 | 2 | 100 | 3 | 700 | Examples |
| 43 | 9 | 36 | 1050 | 2 | 100 | 15 | 1300 | |
| 44 | 8 | 33 | 1050 | 2 | 100 | 8 | 1000 | |
| 45 | 4 | 35 | 1050 | 3 | 100 | 7 | 800 | |
| 46 | 9 | 40 | 900 | 3 | 100 | 15 | 1200 | |
| 47 | 8 | 34 | 950 | 3 | 100 | 8 | 1000 | |
| 48 | 1 | 10 | 1000 | 3 | 100 | 8 | 900 | |
| 49 | 10 | 36 | 1100 | 4 | 100 | 15 | 1600 | |
| 50 | 6 | 33 | 1080 | 4 | 100 | 10 | 1500 | |
| 51 | 5 | 29 | 1050 | 4 | 100 | 3 | 1400 | |
| 52 | 5 | 15 | 1200 | 4 | 120 | 3 | 1000 | |
| 53 | 10 | 37 | 1230 | 4 | 120 | 7 | 1000 | |
| 54 | 7 | 31 | 1250 | 4 | 120 | 13 | 800 | |
| 55 | 9 | 38 | 1300 | 4 | 120 | 15 | 1000 | |
| 56 | 7 | 34 | 1280 | 4 | 120 | 8 | 900 | |

TABLE 5-continued

| | | | | | | | |
|---|---|---|---|---|---|---|---|
| 57 | 3 | 15 | 1150 | 4 | 120 | 4 | 900 |
| 58 | 10 | 37 | 1120 | 5 | 120 | 14 | 1200 |
| 59 | 6 | 31 | 1110 | 5 | 120 | 7 | 1500 |
| 60 | 1 | 21 | 1100 | 5 | 120 | 8 | 1300 |
| 61 | 10 | 39 | 1230 | 5 | 150 | 10 | 1500 |
| 62 | 6 | 33 | 1240 | 5 | 150 | 6 | 1300 |
| 63 | 0 | 5 | 1260 | 4 | 150 | 3 | 1300 |
| 64 | 9 | 39 | 1200 | 10 | 150 | 3 | 1300 |
| 65 | 8 | 35 | 1270 | 10 | 150 | 7 | 1000 |
| 66 | 5 | 23 | 1190 | 10 | 120 | 5 | 1000 |
| 67 | 10 | 39 | 1170 | 3 | 120 | 11 | 1100 |
| 68 | 7 | 34 | 1160 | 4 | 120 | 9 | 1200 |
| 69 | 1 | 18 | 1150 | 3 | 120 | 3 | 1100 |
| 70 | 10 | 39 | 1200 | 10 | 150 | 15 | 1500 |

TABLE 6

| | Composition of sputtering target material (at. %) | | | | | | | | | | | | | | | | | Particle |
|---|---|---|---|---|---|---|---|---|---|---|---|---|---|---|---|---|---|---|
| | | | | | | | | | | Others | | | | | | | Total of | size |
| No. | Co | Fe | B | Ti | Zr | Hf | V | Nb | Ta | Cr | Mo | W | Mn | Ni | Cu | Others | others | condition |
| 71 | 25 | 35 | 20 | 0 | 0 | 0 | 0 | 0 | 20 | 0 | 0 | 0 | 0 | 0 | 0 | — | 20 | B |
| 72 | 20 | 20 | 40 | 0 | 0 | 0 | 0 | 0 | 10 | 0 | 0 | 0 | 0 | 10 | 0 | — | 20 | C |
| 73 | 40 | 10 | 30 | 0 | 0 | 0 | 0 | 0 | 10 | 0 | 0 | 0 | 0 | 0 | 0 | Pt: 10 | 20 | A |
| 74 | 40 | 20 | 20 | 0 | 0 | 0 | 0 | 0 | 0 | 20 | 0 | 0 | 0 | 0 | 0 | — | 20 | C |
| 75 | 30 | 10 | 50 | 0 | 0 | 0 | 0 | 0 | 0 | 10 | 0 | 0 | 0 | 0 | 0 | — | 10 | B |
| 76 | 41 | 18 | 30 | 0 | 0 | 0 | 0 | 0 | 0 | 5 | 0 | 0 | 0 | 0 | 0 | Re: 2, Ru: 1, Rh: 2, Ir: 1 | 11 | C |
| 77 | 40 | 30 | 10 | 0 | 0 | 0 | 0 | 0 | 0 | 0 | 20 | 0 | 0 | 0 | 0 | — | 20 | B |
| 78 | 15 | 40 | 20 | 0 | 0 | 0 | 0 | 0 | 0 | 5 | 0 | 0 | 0 | 0 | 0 | Pd: 5, Pt: 5, Ag: 5 | 20 | A |
| 79 | 15 | 40 | 30 | 0 | 0 | 0 | 0 | 0 | 0 | 15 | 0 | 0 | 0 | 0 | 0 | — | 15 | A |
| 80 | 25 | 45 | 10 | 0 | 0 | 0 | 0 | 0 | 0 | 0 | 20 | 0 | 0 | 0 | 0 | — | 20 | A |
| 81 | 15 | 65 | 10 | 0 | 0 | 0 | 0 | 0 | 0 | 0 | 10 | 0 | 0 | 0 | 0 | — | 10 | B |
| 82 | 60 | 15 | 10 | 0 | 0 | 0 | 0 | 0 | 0 | 0 | 15 | 0 | 0 | 0 | 0 | — | 15 | B |
| 83 | 20 | 50 | 10 | 0 | 0 | 0 | 0 | 0 | 0 | 0 | 0 | 0 | 0 | 0 | 20 | — | 20 | B |
| 84 | 34 | 32 | 20 | 0 | 0 | 0 | 0 | 0 | 0 | 1 | 1 | 1 | 1 | 1 | 4 | Re: 1, Ru: 1, Ir: 1, Pd: 1, Pt: 1, Ag: 1 | 14 | C |
| 85 | 36 | 29 | 20 | 0 | 0 | 0 | 0 | 0 | 0 | 0 | 0 | 0 | 0 | 0 | 10 | Ag: 5 | 15 | C |
| 86 | 30 | 40 | 10 | 0 | 0 | 0 | 0 | 0 | 0 | 0 | 0 | 0 | 0 | 0 | 0 | Re: 20 | 0 | C |
| 87 | 40 | 40 | 10 | 0 | 0 | 0 | 0 | 0 | 0 | 0 | 0 | 0 | 0 | 0 | 0 | Ru: 10 | 0 | A |
| 88 | 49 | 20 | 10 | 21 | 0 | 0 | 0 | 0 | 0 | 0 | 0 | 0 | 0 | 0 | 0 | — | 21 | A |
| 89 | 28 | 30 | 20 | 0 | 0 | 0 | 0 | 10 | 12 | 0 | 0 | 0 | 0 | 0 | 0 | — | 22 | B |
| 90 | 44 | 5 | 30 | 0 | 0 | 0 | 0 | 0 | 10 | 0 | 0 | 0 | 11 | 0 | 0 | — | 21 | C |

| | Particle size | | Molding temperature | Molding time | Molding pressure | Hydrogen content | Bending strength | |
|---|---|---|---|---|---|---|---|---|
| No. | ≤5 μm | ≤30 μm | (° C.) | (h) | (MPa) | (ppm) | (MPa) | Remarks |
| 71 | 8 | 31 | 1220 | 8 | 150 | 5 | 1400 | Present |
| 72 | 4 | 30 | 1200 | 7 | 150 | 3 | 1400 | Invention |
| 73 | 10 | 39 | 1250 | 7 | 150 | 14 | 1400 | Examples |
| 74 | 3 | 25 | 1250 | 7 | 150 | 3 | 1300 | |
| 75 | 8 | 35 | 1270 | 7 | 100 | 10 | 1300 | |
| 76 | 0 | 6 | 1000 | 5 | 100 | 7 | 1500 | |
| 77 | 8 | 33 | 900 | 5 | 100 | 3 | 1300 | |
| 78 | 9 | 36 | 800 | 5 | 130 | 13 | 1200 | |
| 79 | 9 | 36 | 1150 | 7 | 130 | 13 | 1500 | |
| 80 | 10 | 39 | 1150 | 7 | 130 | 15 | 1500 | |
| 81 | 8 | 33 | 1150 | 7 | 130 | 7 | 1600 | |
| 82 | 7 | 32 | 1100 | 3 | 130 | 7 | 1300 | |
| 83 | 7 | 33 | 1000 | 3 | 130 | 7 | 1200 | |
| 84 | 3 | 28 | 1000 | 3 | 130 | 4 | 1300 | |
| 85 | 3 | 20 | 1000 | 3 | 130 | 3 | 1000 | |

TABLE 6-continued

| | | | | | | | | |
|---|---|---|---|---|---|---|---|---|
| 86 | 2 | 18 | 900 | 2 | 130 | 3 | 1000 | |
| 87 | 10 | 35 | 900 | 2 | 130 | 13 | 900 | |
| 88 | 9 | 36 | 1000 | 2 | 130 | 20 | 100 | Comparative |
| 89 | 6 | 33 | 1150 | 2 | 150 | 8 | 100 | Examples |
| 90 | 4 | 28 | 1050 | 2 | 120 | 5 | 100 | |

NOTE:
The underlined figures fall outside the scope of the present invention.

TABLE 7

| | Composition of sputtering target material (at. %) | | | | | | | | | | | | | | | | Mixed raw powders | |
|---|---|---|---|---|---|---|---|---|---|---|---|---|---|---|---|---|---|---|
| | | | | | | | | | Others | | | | | | | | Total of (at %) ( ): | |
| No. | Co | Fe | B | Ti | Zr | Hf | V | Nb | Ta | Cr | Mo | W | Mn | Ni | Cu | Others | others | mixture ratio |
| 91 | 60 | 0 | 30 | 10 | 0 | 0 | 0 | 0 | 0 | 0 | 0 | 0 | 0 | 0 | 0 | — | 10 | Co: 33, B: 1, Ti (90), pure Ti (10) |
| 92 | 65 | 5 | 20 | 0 | 0 | 0 | 0 | 0 | 10 | 0 | 0 | 0 | 0 | 0 | 0 | — | 10 | Co: 20, B: 10, Ta: (93) Fe: 20, B: 10, Ta: (7) |
| 93 | 55 | 15 | 10 | 0 | 0 | 0 | 0 | 0 | 0 | 0 | 10 | 0 | 0 | 0 | 0 | — | 10 | Co: 10, B: 10, Mo: (82) Fe: 10, B: 10, Mo: (18) |
| 94 | 45 | 30 | 15 | 0 | 0 | 0 | 0 | 0 | 0 | 0 | 0 | 0 | 0 | 10 | 0 | — | 10 | Co: 15, B: 10, Ni: (83) Fe: 15, B: 10, Ni: (17) |
| 95 | 15 | 45 | 30 | 0 | 5 | 0 | 0 | 5 | 0 | 0 | 0 | 0 | 0 | 0 | 0 | — | 10 | Co: 30, B: 5, Zr: 5, Nb: (26) Fe: 30, B: 5, Zr: 5, Nb: (74) |
| 96 | 20 | 50 | 20 | 0 | 0 | 0 | 10 | 0 | 0 | 0 | 0 | 0 | 0 | 0 | 0 | — | 10 | Co: 22, B: 8, V: (29), Fe: 15, B: 5, V: (65), pure B: (1), pure V: (5) |
| 97 | 20 | 50 | 10 | 0 | 0 | 5 | 5 | 0 | 0 | 0 | 5 | 0 | 0 | 5 | 0 | — | 20 | Co: 10, B: 5 Hf: 5, V: 5, Mo: 5, Ni: (29) Fe: 10, B: 5, Hf: 5, V: 5, Mo: 5, Ni (71) |
| 98 | 10 | 70 | 10 | 0 | 0 | 0 | 0 | 0 | 0 | 0 | 0 | 0 | 0 | 0 | 0 | Re: 10 | 10 | Co: 10, B: 10, Re: (13) Fe: 10, B: 10, Re: (87) |
| 99 | 20 | 50 | 10 | 0 | 0 | 0 | 0 | 0 | 0 | 0 | 0 | 20 | 0 | 0 | 0 | — | 20 | Co: 10, B: 20, W: (29) Fe: 10, B: 20, W: (71) |
| 100 | 15 | 15 | 50 | 0 | 0 | 0 | 0 | 0 | 0 | 0 | 0 | 0 | 10 | 5 | 5 | — | 20 | Co: 31, Fe: 38, B: (56), pure B: (10), Mn: (16), Ni: (9), Cu: (9) |
| 101 | 0 | 45 | 40 | 0 | 5 | 0 | 0 | 5 | 0 | 0 | 0 | 0 | 0 | 0 | 0 | Pd: 5 | 15 | Fe: 24.7, B: 6.3, Zr: 6.3, Nb: 6.3, Pd (95), B: (5) |
| 102 | 46 | 4 | 40 | 0 | 0 | 0 | 0 | 0 | 0 | 10 | 0 | 0 | 0 | 0 | 0 | — | 10 | Co: 5.7, Fe: 37.9, B: (61), pure Co: (20), pure Fe: (1), pure B: (1), pure Cr: (13) |

TABLE 7-continued

| No. | | | | | | | | | | | | | | | | | | |
|---|---|---|---|---|---|---|---|---|---|---|---|---|---|---|---|---|---|---|
| 103 | 62 | 8 | 10 | 0 | 0 | 0 | 0 | 0 | 0 | 0 | 0 | 0 | 0 | 0 | 0 | Ru: 20 | 20 | Co: 10, B: 20, Ru: (80) Fe: 10, B: 20, Ru: (20) |
| 104 | 71 | 9 | 15 | 0 | 0 | 0 | 0 | 0 | 0 | 0 | 0 | 0 | 0 | 0 | 0 | Pt: 5 | 5 | Co: 10, B: 5, Pt: (87) Fe: 40, B: 5, Pt: (13) |
| 105 | 62 | 13 | 20 | 0 | 0 | 0 | 0 | 0 | 0 | 0 | 0 | 0 | 0 | 0 | 0 | Ag: 5 | 5 | Co: 21, B: 4.4, Ag: (82) Co: 75, Fe: 15, B: 8, Ag: (18) |
| 106 | 32 | 28 | 20 | 1 | 1 | 1 | 1 | 1 | 1 | 1 | 1 | 1 | 1 | 1 | 1 | Re: 1 Ru: 1 Ir: 1 Pd: 1 Pt: 1 Ag: 1 | 20 | Co: 20, B: 1, Ti: 1, Zr: 1, Hf: 1, V: 1, Nb: 1, Ta: 1, Cr: 1, Mo: 1, W: 1, Mn: 1, Ni: 1, Cu: 1, Re: 1, Ru: 1, IR: 1, Pd: 1, Pt: 1, Ag (53) Fe: 20, B: 1, Ti: 1, Zr: 1, Hf: 1, V: 1, Nb: 1, Ta: 1, Cr: 1, Mo: 1, W: 1, Mn: 1, Ni: 1, Cu: 1, Re: 1, Ru: 1, IR: 1, Pd: 1, Pt: 1, Ag (47) |

| No. | Particle size condition | Particle size ≤5 μm | Particle size ≤30 μm | Molding temperature (°C.) | Molding time (h) | Molding pressure (MPa) | Hydrogen content (ppm) | Bending strength (MPa) | Remarks |
|---|---|---|---|---|---|---|---|---|---|
| 91 | A | 10 | 38 | 950 | 2 | 150 | 15 | 1200 | Present |
| 92 | B | 8 | 32 | 1000 | 3 | 130 | 10 | 1200 | Invention |
| 93 | B | 6 | 31 | 900 | 5 | 150 | 9 | 1000 | Examples |
| 94 | C | 4 | 25 | 1000 | 5 | 130 | 3 | 1000 | |
| 95 | C | 4 | 20 | 1050 | 3 | 120 | 3 | 1000 | |
| 96 | A | 9 | 36 | 1050 | 2 | 120 | 14 | 1000 | |
| 97 | A | 10 | 39 | 1200 | 7 | 150 | 14 | 1300 | |
| 98 | B | 7 | 34 | 1200 | 7 | 150 | 10 | 1300 | |
| 99 | B | 7 | 34 | 1200 | 7 | 120 | 10 | 1200 | |
| 100 | C | 3 | 25 | 900 | 5 | 120 | 5 | 1000 | |
| 101 | A | 9 | 30 | 1200 | 10 | 120 | 15 | 1300 | |
| 102 | B | 6 | 33 | 1200 | 10 | 130 | 13 | 1300 | |
| 103 | C | 3 | 24 | 1050 | 3 | 130 | 5 | 1000 | |
| 104 | A | 9 | 39 | 1100 | 3 | 120 | 16 | 1200 | |
| 105 | B | 7 | 35 | 1000 | 2 | 120 | 9 | 1100 | |
| 106 | C | 5 | 19 | 800 | 2 | 120 | 3 | 900 | |

Nos. 1 to 32 shown in Tables 1 to 3 and Nos. 40 to 87 and Nos. 91 to 106 shown in Tables 5 to 7 are present invention examples, while Nos. 33 to 39 shown in Table 4 and Nos. 88 to 90 shown in Table 6 are Comparative Examples.

The particle size distribution of a powder was measured and confirmed by a laser diffraction/scattering-type particle size distribution measurement apparatus (MICROTRAC). Examples of the molding method include, but are not particularly limited to, HIP, hot press, SPS, and hot extrusion. The content of hydrogen was measured by an inert gas fusion-nondispersive infrared absorption method. The mechanical strength (bending strength) of a specimen having a longitudinal length of 4 mm, a width of 25 mm, and a thickness of 3 mm, obtained by division by a wire, was evaluated by a three-point bending test. In the three-point bending test conducted under the condition of a supporting-point distance of 20 mm, a three-point bending strength was calculated from a stress (N) measured when a pressure was applied downward in a thickness direction to a plane having a longitudinal length of 4 mm and a width of 25 mm, on the basis of the following equation. The calculated three-point bending strength was regarded as a bending strength (MPa).

Three-point bending strength (MPa)=(3×stress (N)×supporting-point distance (mm))/(2×specimen width (mm)×(specimen thickness (mm)2)

Nos. 1 to 26 and Nos. 40 to 87 which are present invention examples are sputtering target materials having compositions shown in Tables 1, 2, 5, and 6, while Nos. 27 to 32 and Nos. 91 to 106 which are present invention examples are sputtering target materials produced from plural raw powders shown in Tables 3 and 7. Each sputtering target material was able to achieve a bending strength of 200 MPa or more because of satisfying the condition of the present invention, in which sputtering target material comprises: 10 to 50% of B; 0 to 20% in total of one or more elements selected from the group consisting of Ti, Zr, Hf, V, Nb, Ta, Cr, Mo, W, Mn, Re, Ru, Rh, Ir, Ni, Pd, Pt, Cu, and Ag; and the balance of at least one of Co and Fe, and unavoidable impurities, wherein a hydrogen content is 20 ppm or less.

In contrast, in Comparative Example No. 33 shown in Table 4, a hydrogen content increased to 25 ppm, and a bending strength decreased to 150 MPa because the cumulative volume of particles having a particle diameter of 5 μm or less in the particle size distribution of a gas-atomized powder used as a raw material of the sputtering target material was 11% and satisfied none of the particle size conditions A to C. In Comparative Example No. 34, a hydrogen content increased to 30 ppm, and a bending strength decreased to 180 MPa because the content of B was less than 10%, and the cumulative volume of particles having a particle diameter of 30 μm or less in the particle size distribution of a gas-atomized powder used as a raw material of the sputtering target material was 41%. In Comparative Example Nos. 35 and 37, hydrogen contents increased to 25 ppm and 23 ppm, and bending strengths decreased to 130 MPa and 150 MPa because the cumulative volumes of particles having a particle diameter of 5 μm or less in the particle size distributions of gas-atomized powders used as raw materials of the sputtering target materials were 12% and 13% and satisfied none of the particle size conditions A to C.

In Comparative Example Nos. 36 and 38, hydrogen contents increased to 22 ppm and 25 ppm, and bending strengths decreased to 160 MPa and 140 MPa because the cumulative volumes of particles having a particle diameter of 30 μm or less in the particle size distributions of gas-atomized powders used as raw materials of the sputtering target materials were 42% and 43% and satisfied none of the particle size conditions A to C. In Comparative Example No. 39, a hydrogen content increased to 26 ppm, and a bending strength decreased to 100 MPa because the cumulative volumes of particles having particle diameters of 5 μm or less and 30 μm or less in the particle size distribution of a gas-atomized powder used as a raw material of the sputtering target material were 14% and 45% and satisfied none of the particle size conditions A to C. The strengths in Comparative Examples are found to be very poor. Comparative Example Nos. 88 to 90 shown in Table 6 are found to result in low strength and brittleness because of comprising more than 20% in total of one or more elements selected from the group consisting of Ti, Zr, Hf, V, Nb, Ta, Cr, Mo, W, Mn, Re, Ru, Rh, Ir, Ni, Pd, Pt, Cu, and Ag.

According to the present invention, a sputtering target material of which the mechanical strength is improved by decreasing the content of hydrogen in the sputtering target material to 20 ppm or less is provided as described above. The sputtering target material according to the present invention is a sputtering target material useful for producing an alloy thin film in an MTJ element, an HDD, a medium for magnetic recording, or the like and exhibits a very excellent effect.

The invention claimed is:

1. A method of making a sputtering target, comprising:
providing an atomized powder consisting of, in at. %:
10 to 50% of B;
0 to 20% in total of one or more elements selected from the group consisting of Ti, Zr, Hf, V, Nb, Ta, Cr, Mo, W, Mn, Re, Ru, Rh, 1r, Ni, Pd, Pt, Cu, and Ag; and
a balance of one or both of Co and Fe, and unavoidable impurities;
removing fine particles from the atomized powder to obtain a powder that has a particle distribution where the cumulative volume of particles having a particle diameter of 5 μm or less is 10% or less, and the cumulative volume of particles having a particle diameter of 30 μm or less is 5% or more and 40% or less; and
sintering the obtained powder to form a sputtering target, wherein the sputtering target comprises hydrogen of 20 ppm or less.

2. The method of claim 1, wherein the removing step is performed by classification using a sieve having an opening of 35 μm.

3. The method of claim 1, wherein the powder obtained in the removing step has a particle distribution where the cumulative volume of particles having a particle diameter of 5 μm or less is 8% or less, and the cumulative volume of particles having a particle diameter of 30 μm or less is 5% or more and 35% or less.

4. The method of claim 3, wherein the removing step is performed by classification using a sieve having an opening of 30 μm.

5. The method of claim 1, wherein the powder obtained in the removing step has a particle distribution where the cumulative volume of particles having a particle diameter of 5 μm or less is 5% or less, and the cumulative volume of particles having a particle diameter of 30 μm or less is 5% or more and 30% or less.

6. The method of claim 5, wherein the removing step is performed by classification using a sieve having an opening of 25 μm.

7. The method according to claim 1, wherein the atomized powder comprises, in at. %, 5 to 20% in total of one or more elements selected from the group consisting of Ti, Zr, Hf, V, Nb, Ta, Cr, Mo, W, Mn, Re, Ru, Rh, Ir, Ni, Pd, Pt, Cu, and Ag.

8. The method according to claim 3, wherein the atomized powder comprises, in at. %, 5 to 20% in total of one or more elements selected from the group consisting of Ti, Zr, Hf, V, Nb, Ta, Cr, Mo, W, Mn, Re, Ru, Rh, Ir, Ni, Pd, Pt, Cu, and Ag.

9. The method according to claim 5, wherein the atomized powder comprises, in at. %, 5 to 20% in total of one or more elements selected from the group consisting of Ti, Zr, Hf, V, Nb, Ta, Cr, Mo, W, Mn, Re, Ru, Rh, Ir, Ni, Pd, Pt, Cu, and Ag.

10. The method of claim 1, wherein the sputtering target has a bending strength of 200 MPa or more.

11. The method of claim 3, wherein the sputtering target has a bending strength of 200 MPa or more.

12. The method of claim 5, wherein the sputtering target has a bending strength of 200 MPa or more.

* * * * *